United States Patent
Alhussien et al.

(10) Patent No.: US 9,817,708 B2
(45) Date of Patent: Nov. 14, 2017

(54) DEVICE QUALITY METRICS USING UNSATISFIED PARITY CHECKS

(71) Applicant: Seagate Technology LLC, Cupertino, CA (US)

(72) Inventors: AbdelHakim S. Alhussien, San Jose, CA (US); Earl T. Cohen, Oakland, CA (US); Erich F. Haratsch, San Jose, CA (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 15/297,574

(22) Filed: Oct. 19, 2016

(65) Prior Publication Data

US 2017/0039098 A1    Feb. 9, 2017

Related U.S. Application Data

(63) Continuation of application No. 14/101,679, filed on Dec. 10, 2013, now Pat. No. 9,489,256.

(60) Provisional application No. 61/901,064, filed on Nov. 7, 2013.

(51) Int. Cl.

| | |
|---|---|
| *H03M 13/00* | (2006.01) |
| *G06F 11/07* | (2006.01) |
| *G06F 11/10* | (2006.01) |
| *G11B 20/18* | (2006.01) |
| *G06F 11/30* | (2006.01) |

(Continued)

(52) U.S. Cl.
CPC .......... *G06F 11/076* (2013.01); *G06F 11/079* (2013.01); *G06F 11/0727* (2013.01); *G06F 11/1068* (2013.01); *G11B 20/1833* (2013.01); *H03M 13/612* (2013.01); *H03M 13/6516* (2013.01); *G06F 11/3037* (2013.01); *G06F 11/3065* (2013.01); *G11B 2020/185* (2013.01); *H03M 13/114* (2013.01); *H03M 13/1108* (2013.01); *H03M 13/1128* (2013.01); *H03M 13/3753* (2013.01)

(58) Field of Classification Search
CPC .......... H03M 13/116; H03M 13/6511; H03M 13/353; H03M 13/1171; H03M 13/1111; H03M 13/1128; H03M 13/1108; G06F 11/10; G06F 11/1068
USPC ................ 714/807, 758, 755, 786
See application file for complete search history.

(56) References Cited

U.S. PATENT DOCUMENTS

| | | | |
|---|---|---|---|
| 7,454,685 B2 | 11/2008 | Kim et al. | 714/758 |
| 8,381,074 B1 | 2/2013 | Gunnam et al. | 714/764 |
| 8,413,010 B1 | 4/2013 | Vasquez et al. | 714/758 |

(Continued)

*Primary Examiner* — Guy Lamarre

(74) *Attorney, Agent, or Firm* — Christopher P. Maiorana, PC

(57) ABSTRACT

An apparatus includes a memory and a controller. The memory may be configured to store data. The controller may be configured to process a plurality of read/write operations to/from the memory, receive a codeword from the memory, generate a plurality of syndromes of the codeword at a plurality of possible code rates, generate a plurality of count values by counting a number of unsatisfied parity checks in each of the plurality of syndromes, generate a plurality of normalized values by dividing the plurality of count values by a plurality of lengths of the plurality of possible code rates respectively, and determine a bit error rate value of the memory based on a lowest value among the plurality of normalized values.

20 Claims, 12 Drawing Sheets

(51) Int. Cl.
*H03M 13/11* (2006.01)
*H03M 13/37* (2006.01)

(56) References Cited

U.S. PATENT DOCUMENTS

| | | |
|---|---|---|
| 8,499,227 B2 | 7/2013 | Liikanen et al. ............. 714/786 |
| 9,059,742 B1 | 6/2015 | Anderson |
| 9,489,256 B2 * | 11/2016 | Alhussien ........... G06F 11/1068 |
| 2008/0126908 A1 | 5/2008 | Lin ............... 714/758 |
| 2011/0202816 A1 | 8/2011 | Lin et al. ...... 714/758 |
| 2011/0246862 A1 | 10/2011 | Graef ........... 714/785 |
| 2011/0320902 A1 | 12/2011 | Gunnam ........ 714/752 |
| 2013/0145085 A1 | 6/2013 | Yu ................ 711/103 |
| 2015/0149855 A1 | 5/2015 | Alhussien et al. ........... 714/758 |

* cited by examiner

DEVICE QUALITY METRICS USING UNSATISFIED PARITY CHECKS

This application relates to U.S. Ser. No. 14/101,679, filed Dec. 10, 2013, now U.S. Pat. No. 9,489,256, issued Nov. 8, 2016, which relates to U.S. Provisional Application No. 61/901,064, filed Nov. 7, 2013, each of which are hereby incorporated by reference in their entirety.

FIELD OF THE INVENTION

The invention relates to quality metrics determinations generally and, more particularly, to a method and/or apparatus for implementing device quality metrics using unsatisfied parity checks.

BACKGROUND

Knowing a raw bit error rate of a flash device block, or other storage system, is useful for identifying a source of a read failure, such as in a debugging mode. The raw bit error rate helps distinguish between system failures and data corruption due to degraded storage media, sometimes experienced in heavily program/erase cycled flash media. Data corruption can also be due to long retention times and heavy read cycles in the flash media. When the storage device is suffering from severe data corruption and high bit error rates, an error correction coding performed in a read channel will fail to converge. Thus, the error correction coding cannot provide the original data against which the bit error rate is measured. Hence, a technique is desired to use the correction code constraints to roughly estimate the raw bit error rate when the error correction code cannot converge.

SUMMARY

The invention concerns an apparatus including a memory and a controller. The memory may be configured to store data. The controller may be configured to process a plurality of read/write operations to/from the memory, receive a codeword from the memory, generate a plurality of syndromes of the codeword at a plurality of possible code rates, generate a plurality of count values by counting a number of unsatisfied parity checks in each of the plurality of syndromes, generate a plurality of normalized values by dividing the plurality of count values by a plurality of lengths of the plurality of possible code rates respectively, and determine a bit error rate value of the memory based on a lowest value among the plurality of normalized values.

BRIEF DESCRIPTION OF THE FIGURES

Embodiments of the invention will be apparent from the following detailed description and the appended claims and drawings in which:

DETAILED DESCRIPTION OF THE EMBODIMENTS

Figure 1:
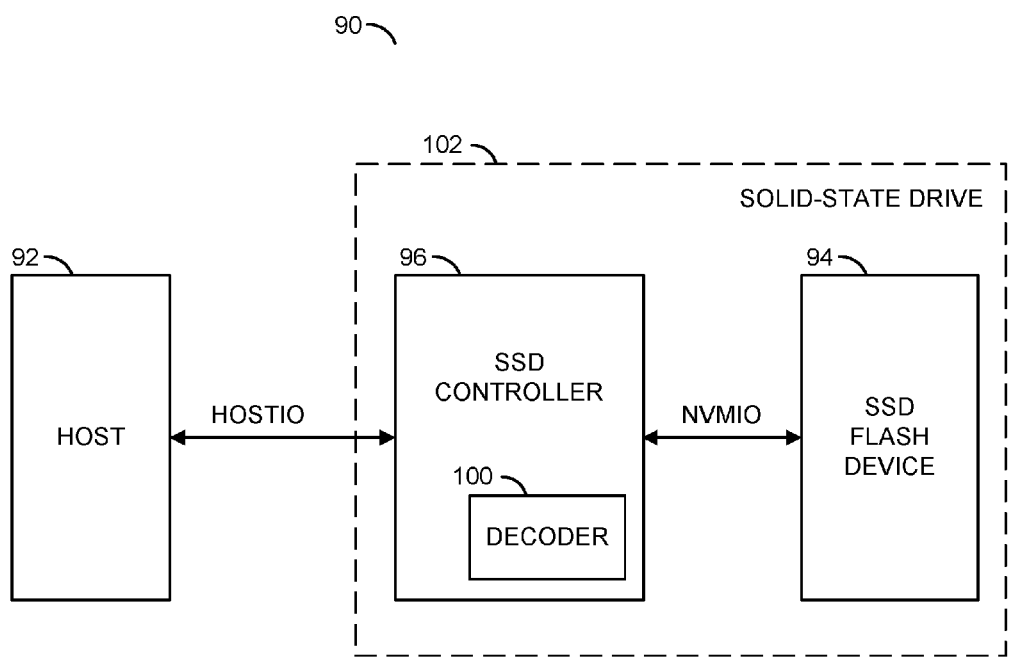
FIG. 1 is a block diagram of an apparatus.

Embodiments of the invention include providing device quality metrics using unsatisfied parity checks that may (i) count a number of failed checks during a portion of a decoding process, (ii) estimate how many read errors exist in uncorrected and/or uncorrectable read data, (iii) calculate the estimate without the decoding process converging, (iv) calculate the estimate without knowing the original error-free data, (v) determine a code rate of the data, (vi) be used for manufacturing qualification where the data is unknown and/or (vii) be implemented as one or more integrated circuits.

Embodiments of the present invention provide a technique and/or apparatus that estimate a raw bit error rate (e.g., RBER) for data received from a device without having knowledge (possibly due to a lack of access) to the original error-free data conveyed by the device. In some embodiments, the device is a storage device. The storage devices may include, but are not limited to, flash memory devices, solid-state drives, magnetic disk drives, optical drives, electro-magneto drives, tape drives and the like. In other embodiments, the device is a communication device. The communication devices may include, but are not limited to, wired communication devices, wireless communication devices, optical communication device, radio frequency communication devices and the like.

Consider a solid-state drive type of storage device where firmware/software in a controller is not functional, or any other system failure occurs, and so a code rate used to write a block of data (e.g., a codeword) is unknown. A code rate is defined as a number of user data symbols in a codeword divided by a total number of symbols in the codeword. The code rate that was used to encode the written data is determined, even in the presence of errors in the written data, by computing a normalized number of unsatisfied checks over the written data for all possible system code rates as quality metric (e.g., QM) values. A particular code rate that corresponds to a minimum value amongst the quality metric values is considered to be the estimated code rate of the written data.

An advantage of the invention herein is that performing many potential iterations of the iterative decoding procedure to converge to a zero syndrome (e.g., correct all errors in a codeword) is avoided. The quality metric value is generally calculated within one or less iterations of the decoding process though more iterations may be run as appropriate. For instance, consider an adaptive coding scheme with N (e.g., 8) code rates with data encoded using a given code rate (e.g., code rate 0). Decoding is performed on one or more codewords at all N available code rates. Early in the iterative decoding, a normalized quality metric (e.g., QM(k)=number of unsatisfied checks of code rate k per length of the code rate k) for each code rate k can be calculated. Hence, the number of unsatisfied checks normalized by the codeword length for the given code rate is always the minimum value because the block is written using the given code rate. Generally, for a column weight q code, a single raw bit error causes q unsatisfied checks. Therefore, an almost linear relationship exists between the quality metrics and the raw bit error rate, especially at very low bit error rates when not many decoder iterations are run. The linear relationship can be used to calculate the raw bit error rate from the number of unsatisfied checks. In some embodiments, a square-law, cubic-law, or higher order polynomial-law type fit for the relationship may be used for high accuracy, especially at high bit error rates to capture any non-linearity in the relationship. Other curve fitting routines may be implemented to meet the criteria of a particular application.

Referring to FIG. 1, a block diagram of an example implementation of an apparatus 90 is shown. The apparatus (or circuit or device or integrated circuit) 90 implements a computer having a nonvolatile memory circuit. The apparatus 90 generally comprises a block (or circuit) 92, a block (or circuit) 94 and a block (or circuit) 96. The circuit 96 generally comprises a block (or circuit) 100. The circuits 94, 96 and 100 form a drive (or device) 102. The circuits 92 to 102 may represent modules and/or blocks that may be implemented as hardware, software, a combination of hardware and software, or other implementations.

One or more signals (e.g., HOSTIO) are exchanged between the circuit 92 and the circuit 96. The host input/output signal HOSTIO generally includes, but is not limited to, a logical address component used to access data in the circuit 102, a host command component that controls the circuit 102, a write data component that transfers write data from the circuit 92 to the circuit 96 and a read data component that transfers error corrected read data from the circuit 96 to the circuit 92. One or more signals (e.g., NVMIO) are exchanged between the circuit 96 and the circuit 94. The nonvolatile memory input/output signal NVMIO generally includes, but is not limited to, a physical address component used to access data in the circuit 94, a memory command component that controls the circuit 94 (e.g., read or write commands), a write codeword component that carries error correction coded and cyclical redundancy check protected write codewords written from the circuit 96 into the circuit 94 and a read codeword component that carries the error correction coded codewords read from the circuit 94 to the circuit 96.

The circuit 92 is shown implemented as a host circuit. The circuit 92 is generally operational to read and write data to and from the circuit 94 via the circuit 96. When reading or writing, the circuit 92 transfers a logical address value in the signal HOSTIO to identify which set of data is to be written or to be read from the circuit 94. The address generally spans a logical address range of the circuit 102. The logical address can address individual data units, such as SATA (e.g., serial-ATA) sectors.

The circuit 94 is shown implementing one or more nonvolatile memory circuits (or devices). According to various embodiments, the circuit 94 comprises one or more nonvolatile semiconductor devices. The circuit 94 is generally operational to store data in a nonvolatile condition. When data is read from the circuit 94, the circuit 94 accesses a set of data (e.g., multiple bits) identified by the address (e.g., physical address) in the signal NVMIO. The address generally spans a physical address range of the circuit 94.

The circuit 96 is shown implementing a controller circuit. The circuit 96 is generally operational to control reading to and writing from the circuit 94. The circuit 96 comprises one or more integrated circuits (or chips or die) implementing the controller of one or more solid-state drives (e.g., SSD), embedded storage, or other suitable control applications.

The circuit 100 is shown implemented as a decoder circuit. The circuit 100 is generally operational to decode the read codewords received from the circuit 94. The resulting decoded data is presented to the circuit 92 via the signal HOSTIO and/or re-encoded and written back into the circuit 94 via the signal NVMIO. As part of the decoding, the circuit 100 generates a syndrome (each syndrome having multiple parity checks) by performing a syndrome computation process on the read codeword. In some embodiments, the syndrome computation process is a portion less than all of an iterative decoding procedure. In other embodiments, the syndrome computation process evaluates the read codeword using the H matrix of the code to determine which check equations are satisfied and which are not. The circuit 100 also generates a count value by counting a number of unsatisfied parity checks in the syndrome. The circuit 100 (or the circuit 96) generates a quality metric (e.g., QM) value of the circuit 94 (or the circuit 102) according to the count value. A transformation from the count value to the quality metic value may be achieved by a linear transformation, a cubic transformation, a formulaic computation, a polynomial transformation (e.g., a third-degree polynomial), a table look-up or other transformation. In some embodiments, the transformation is according to the code rate. For example, the functions and/or coefficients thereof used in the transformation are selected according to the code rate. Moreover, the functions and/or coefficients used in the transformation can be selected according to additional code parameters such as the column weight distribution, the row weight distribution, the decoding technique implemented in the circuit 100 or any other code attributes that can affect the relationship between the bit error rate and the number of unsatisfied checks.

The circuit 102 is shown implementing a solid-state drive. The circuit 102 is generally operational to store data generated by the circuit 92 and return the data to the circuit 92. According to various embodiments, the circuit 102 comprises one or more: nonvolatile semiconductor devices, such as NAND Flash devices, phase change memory (e.g., PCM) devices, or resistive RAM (e.g., ReRAM) devices; portions of a solid-state drive having one or more nonvolatile devices; and any other volatile or nonvolatile storage media. The circuit 102 is generally operational to store data in a nonvolatile condition.

Numerical studies show a strong linear relationship between the raw bit errors in codewords and the number of unsatisfied check discovered in an initial portion of the decoding process. The number of unsatisfied checks as a relative metric offers several advantages. For example, a granularity of about 1 bit per 4 unsatisfied checks may be determined, where a column-weight 4 code is assumed for the bit location. In general, the relationship is a function of column weight. For instance, a column weight 3 low density parity check code (e.g., LDPC) produces a granularity of about 1 bit per 3 unsatisfied checks. Moreover, the smaller the column weight the better the resolution if the row weight stays the same. In general, as the code rate approaches 0.5, the linearity range improves and the granularity improves. Whether the column weight is regular or irregular, the final relationship of the number of unsatisfied checks and the raw bit error rate will be determined by the average of all code bit degrees.

The unsatisfied checks can be determined in a number of ways, such as with just (M−1)/M of an iteration of a layered decoder, where M is the number of layers in the parity direction of the layered decoder. Therefore, the metric is computed by less than a single iteration time at best. Furthermore, there is an almost linear relationship below bit error rates of $10^{-2}$ or up to the number of parity bits normalized by the codeword length. In other embodiments, running more than a single iteration can result in a different number of unsatisfied checks per error bit, and hence the transformation from the quality metric to the raw bit error rate should be a function of the number of iterations run and the number of layers in a layered type decoder used in the computation.

Figure 2:
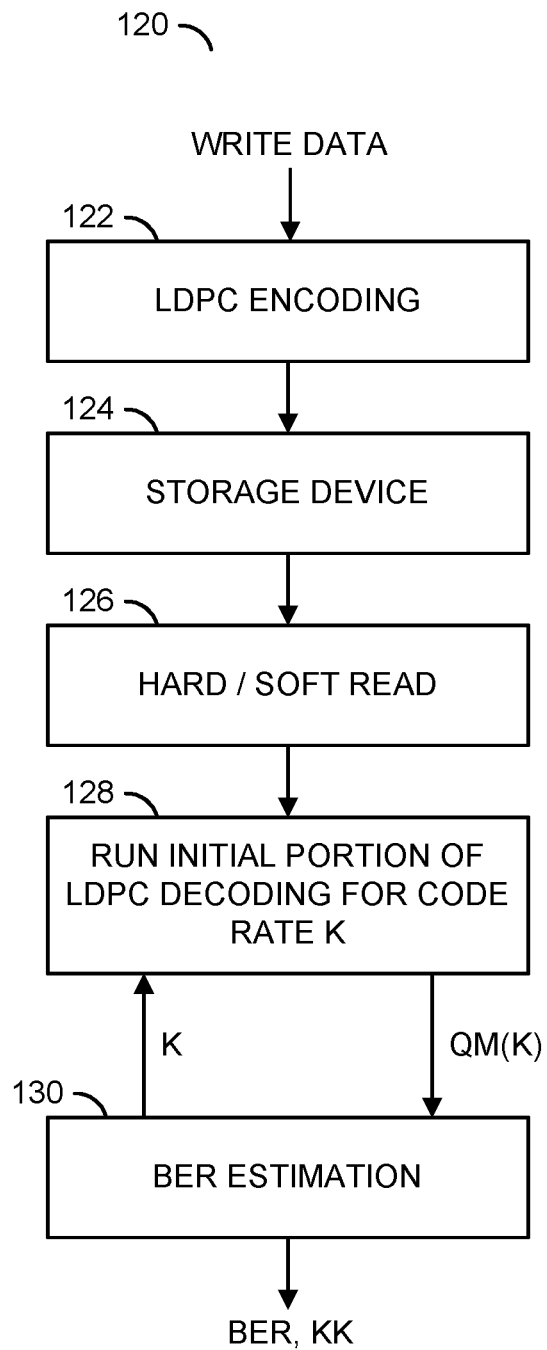
FIG. 2 is a flow diagram of a method for calculating an estimated raw bit error rate in accordance with an embodiment of the invention.

Referring to FIG. 2, a flow diagram of an example method 120 for calculating an estimated raw bit error rate is shown in accordance with an embodiment of the invention. The method (or process) 120 is implemented in the circuit 100, the circuit 96 and/or the circuit 102. The method 120 generally comprises a step (or state) 122, a step (or state) 124, a step (or state) 126, a step (or state) 128, and a step (or state) 130. The steps 122 to 130 may represent modules and/or blocks that may be implemented as hardware, software, a combination of hardware and software, or other implementations.

Write data may be received by the circuit 96 from the circuit 92. The circuit 96 encodes the write data at a given code rate using an encoding process (e.g., a low density parity check process at a code rate 0) in the step 122. The encoded write data, sometimes referred to as a codeword, is written into the circuit 94 by the circuit 96 in the step 124.

In the step 126, the circuit 96 reads the previously written codeword using a hard (e.g., binary) read technique. The same outcome of step 126 can be reached if multiple hard reads, or a direct soft read occur as the desired hard read is a subset of the reads. The circuit 100 generates a quality metric (e.g., QM(K)) by running an initial portion of a decoding process (e.g., the low density parity check process) in the step 128 at a current code rate K. The quality metric QM(K) is generally the number of unsatisfied parity checks divided by the codeword length when using the parity check matrix of code K.

In the step 130, the circuit 100 may initiate a repeat of the decoding process using a different code rate K if, for example, the code rate is not known a priori. Returning to the step 128, the circuit 100 runs the initial portion of the decoding process on the read codeword at the different code rate. A loop between the steps 128 and 130 is repeated until all of the possible code rates have been checked. An estimation of the raw bit error rate is generated in the step 130 by identifying a lowest quality metric value and mapping that value to a bit error rate value. The step 130 ends the method 120 by generating one or more signals conveying (i) the estimated bit error rate value and (ii) a particular (estimated) code rate KK that resulted in the corresponding the lowest quality matric value.

Figure 3:
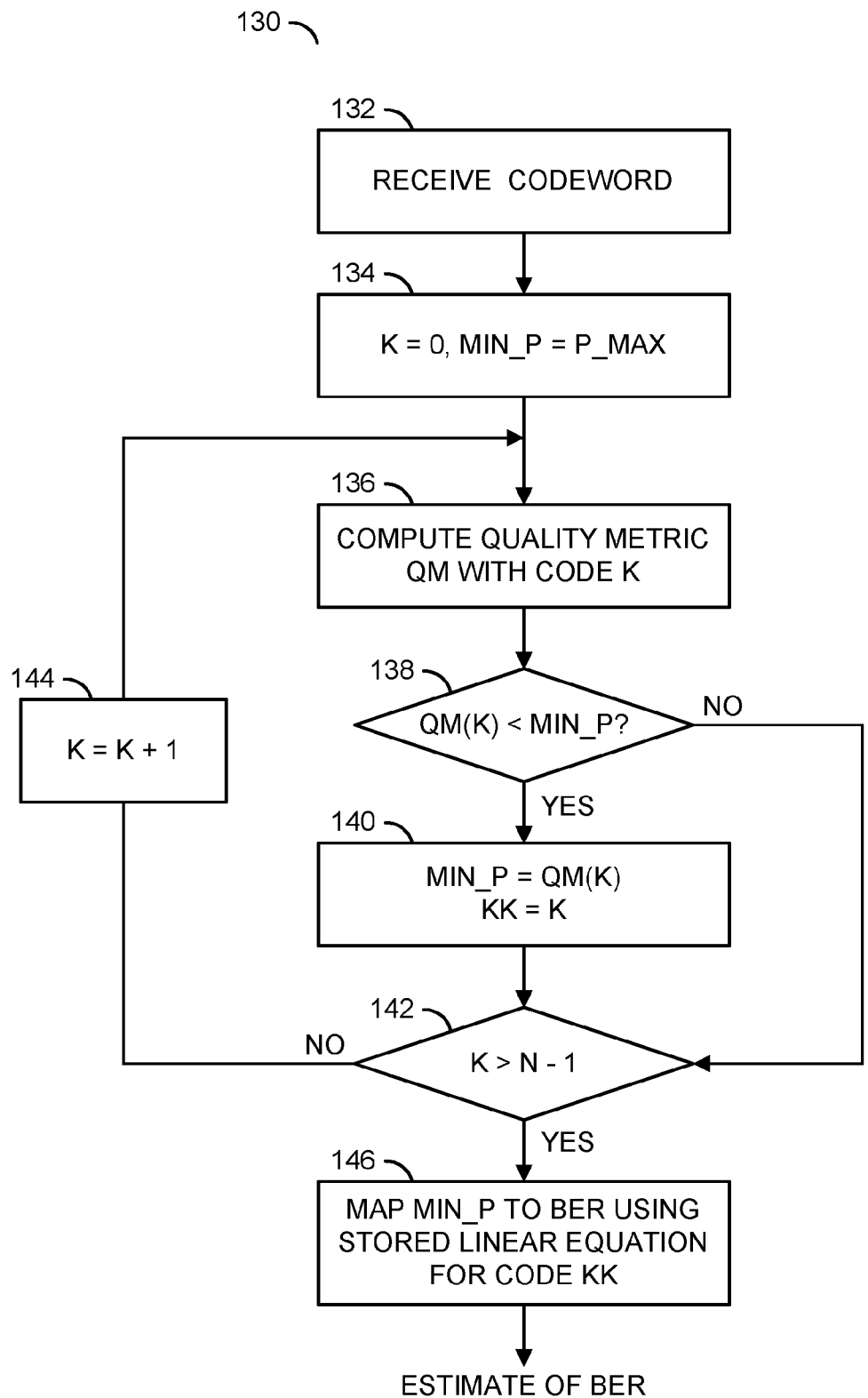
FIG. 3 is a detailed flow diagram of a raw bit error rate estimation step.

Referring to FIG. 3, a detailed flow diagram of the raw bit error rate estimation step 130 is shown. The method (or process) 130 is implemented in the circuit 100, the circuit 96 and/or the circuit 102. The method 130 generally comprises a step (or state) 132, a step (or state) 134, a step (or state) 136, a step (or state) 138, a step (or state) 140, a step (or state) 142, a step (or state) 144, and a step (or state) 146. The steps 132 to 146 may represent modules and/or blocks that may be implemented as hardware, software, a combination of hardware and software, or other implementations.

In the step 132, the circuit 100 receives the read codeword from the circuit 94. A code rate K is initialized to an initial rate (e.g., code rate 0), and a current smallest quality metric value (e.g., MIN_P) among the N code rates (e.g., K=0 to K=N−1) is initialized to a maximum possible quality metric value (e.g., P_MAX) in the step 134. The value of P_MAX is the largest number of checks among the N codes. In the step 136, the quality metrics for the codeword as decoded using the code rate K are calculated.

A check is performed in the step 138 to determine if the just-calculated quality metric value QM(K) is better (e.g., having a lower value) than the current smallest quality metric value MIN_P. If the just-calculated quality metric value QM(K) is better, the circuit 100 sets the current smallest quality metric value MIN_P to the just-calculated quality metric value QM(K) and sets a current code rate (e.g., KK) to the current code rate K in the step 140. Once the current values have been updated, or if the just-calculated quality metric QM(K) is larger than the current smallest quality metric value MIN_P, the method continues with the step 142.

In the step 142, a check is made to see if any more code rates K remain to be checked. If code rates remain unchecked, the circuit 100 increments the current code rate K in the step 144 and returns to the step 136. Once all of the code rates have been checked, the circuit 100 maps the surviving current smallest quality metric value MIN_P to a bit error rate in the step 146 using the stored transformation for the current code rate KK. The bit error rate and the current code rate are presented from the step 146.

Figure 4:
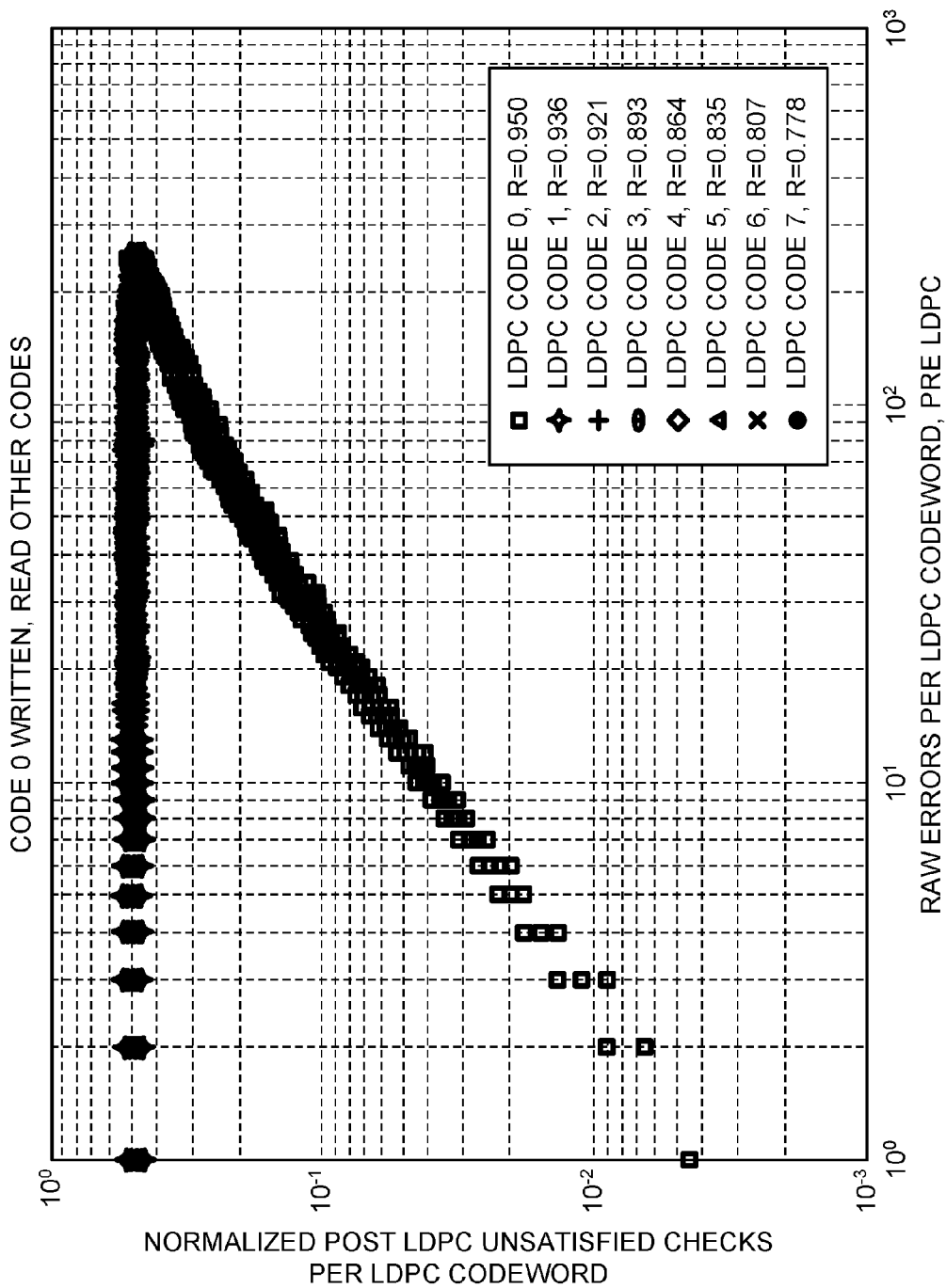
FIG. 4 is a graph of raw bit error rate versus normalized unsatisfied checks per low density parity check codeword for various code rates.

Referring to FIG. 4, a graph of raw bit error rate versus normalized unsatisfied checks per low density parity check codeword for various code rates is shown, were the codewords are encoded using code rate 0. The graph generally illustrates an approximately linear relationship (bottom sloped line) between the normalized unsatisfied checks and raw bit error per low density parity check codeword at the code rate 0 (e.g., rate=0.950). The normalized unsatisfied checks at the other code rates are all approximately the same (top horizontal line) and generally higher than the code rate 0 line.

Figure 5:
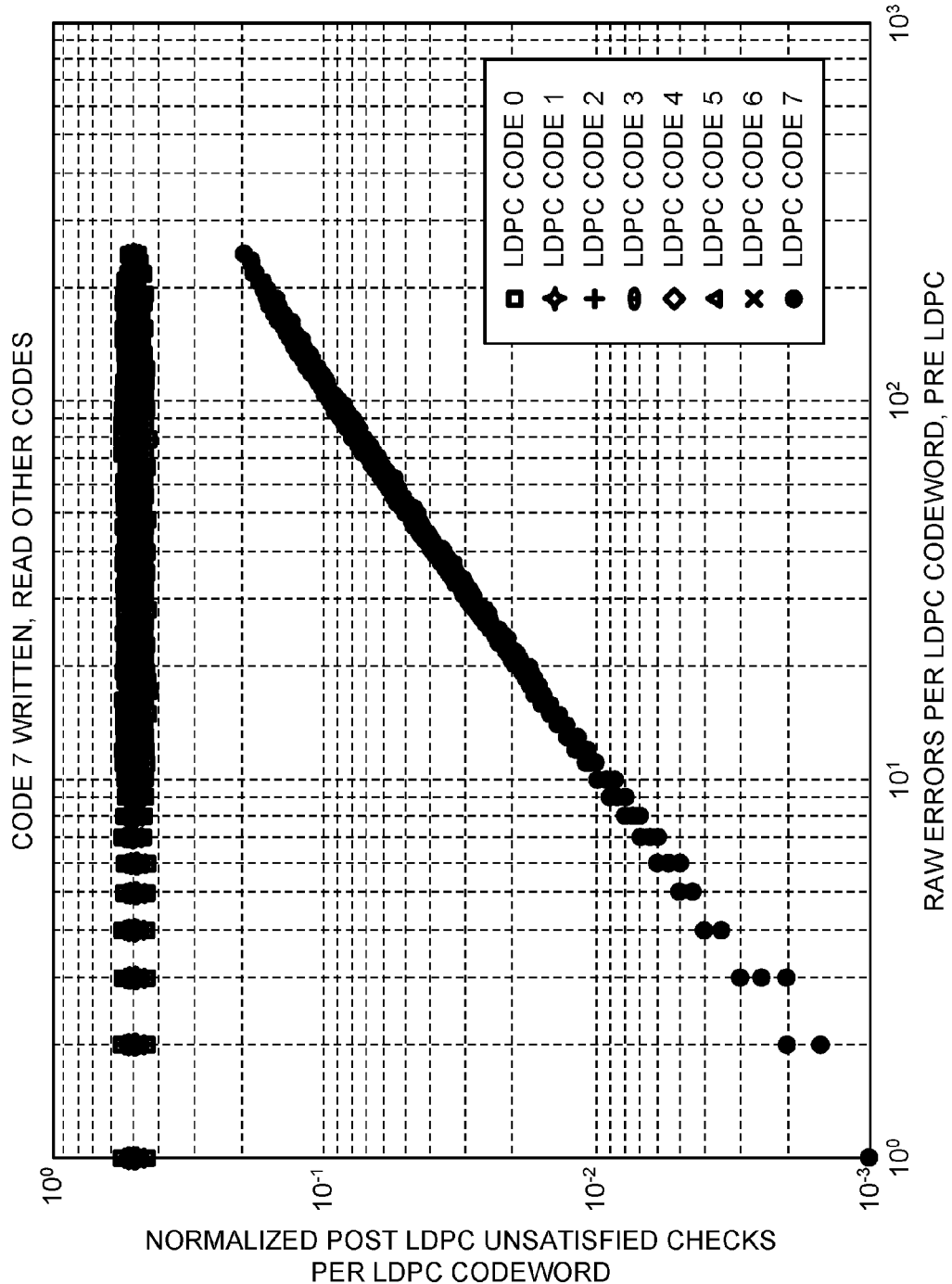
FIG. 5 is a graph of raw bit error rate versus normalized unsatisfied checks per low density parity check codeword for various code rates.

Referring to FIG. 5, a graph of raw bit error rate versus normalized unsatisfied checks per low density parity check codeword for various code rates is shown, where the codewords are encoded using code rate 7. The graph generally illustrates an approximately linear relationship (bottom sloped line) between the normalized unsatisfied checks and raw bit error per low density parity check codeword at the code rate 7 (e.g., rate=0.778). The normalized unsatisfied checks at the other code rates are all approximately the same (top horizontal line) and higher than the code rate 7 line.

Figure 6:
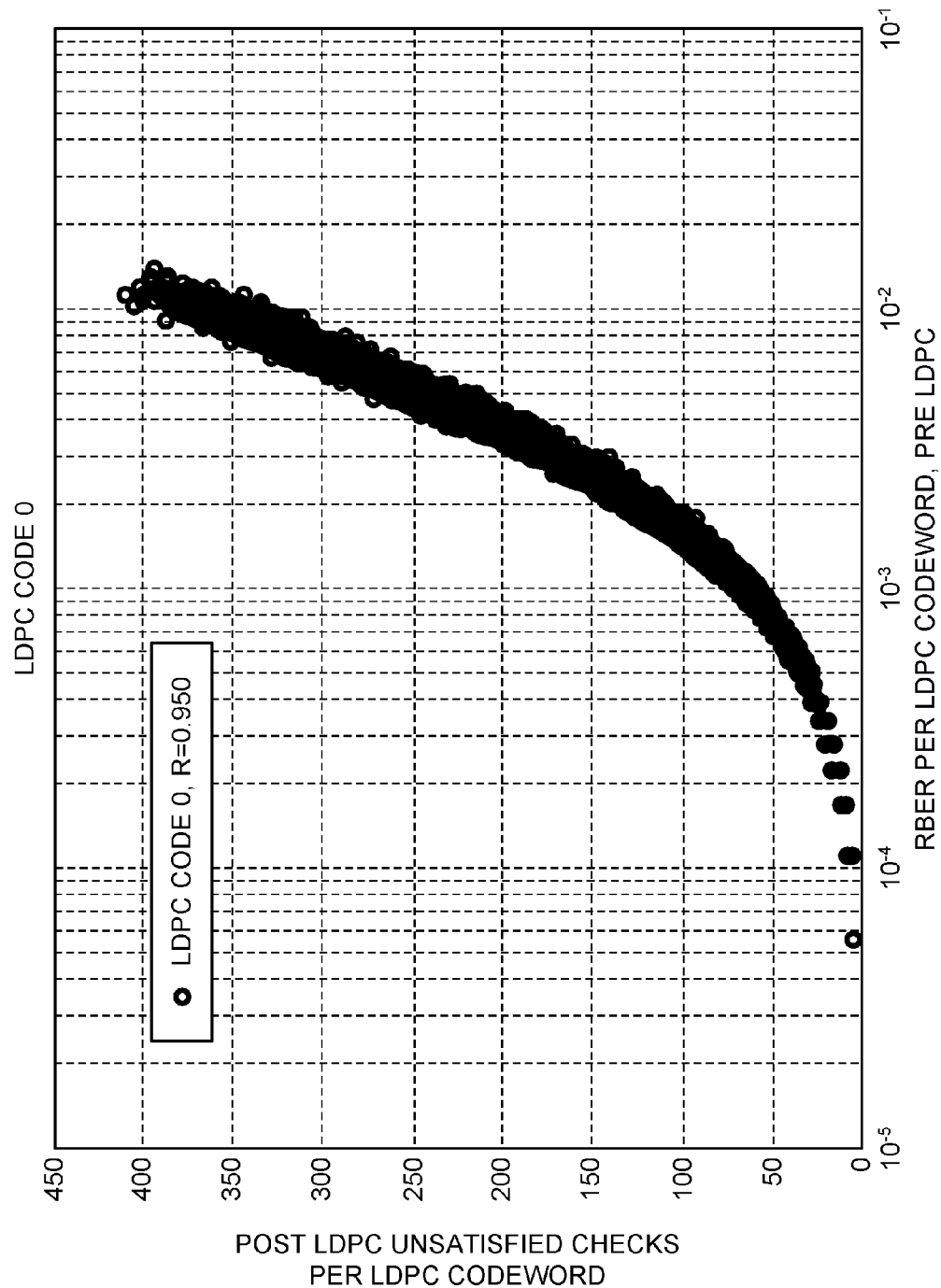
FIG. 6 is a graph of raw bit error rate versus unsatisfied checks per low density parity check codeword for the code rate 0.

Referring to FIG. 6, a graph of raw bit error rate versus unsatisfied checks per low density parity check codeword for the code rate 0 is shown. Simulations show that to a certain number of errors, the relationship with the number of unsatisfied checks is linear. The graph generally illustrates an approximately linear relationship between the unsatisfied checks and raw bit error per low density parity check codeword.

In column weight 4 codes, the number of unsatisfied checks is roughly 4 times the number of errors for a wide range of raw bit error rates. In an extreme case of a single error, 4 unsatisfied checks should be created early in the decoding process. The 4 to 1 ratio generally persists for a wide range of error values. A careful study of FIG. 6 shows behavior that is consistent with this property of the code.

Figure 7:
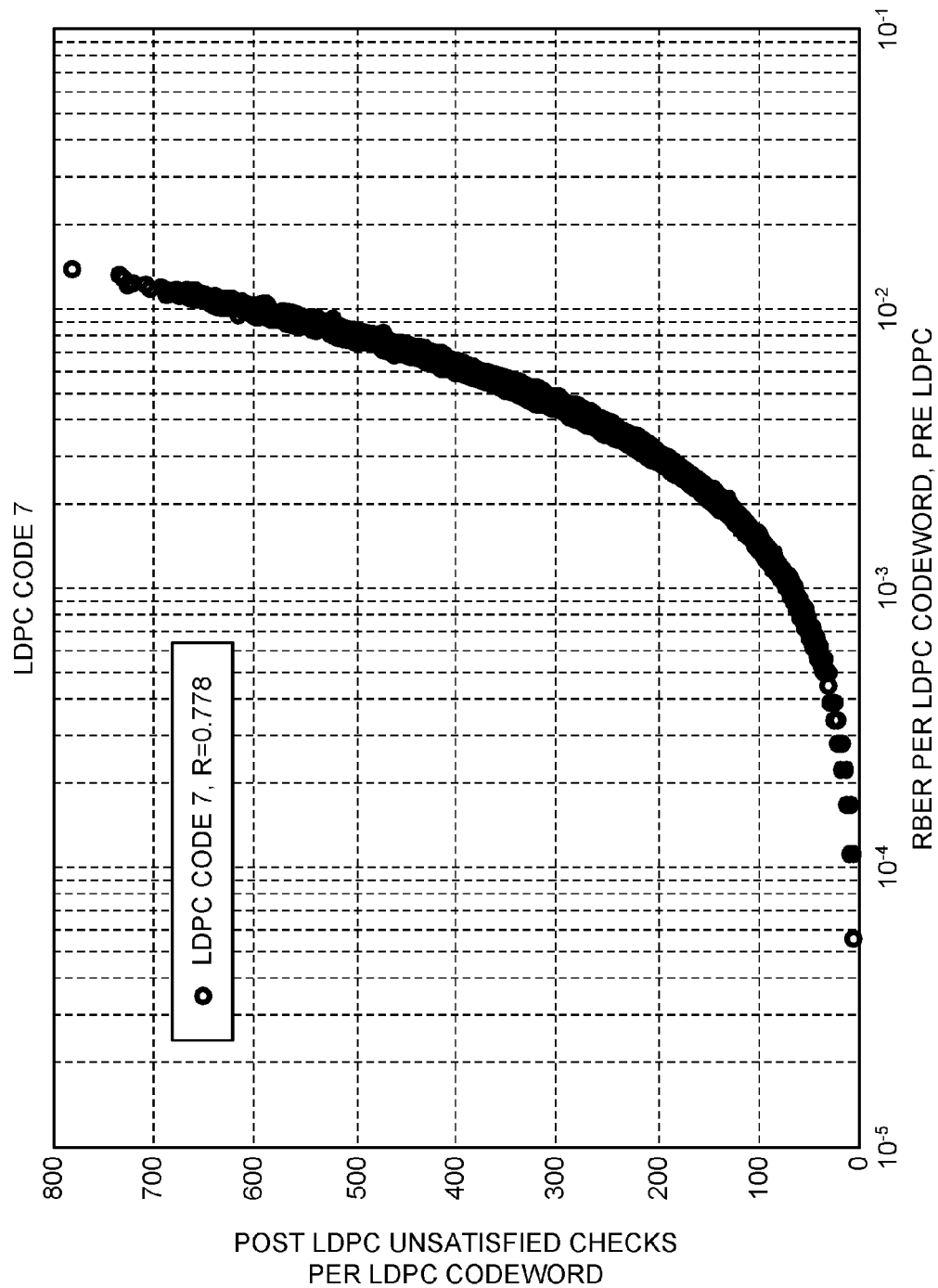
FIG. 7 is a graph of raw bit error rate versus unsatisfied checks per low density parity check codeword for the code rate 7.

Referring to FIG. 7, a graph of raw bit error rate versus unsatisfied checks per low density parity check codeword for the code rate 7 is shown. The graph generally illustrates an approximately linear relationship between the unsatisfied checks and raw bit error per low density parity check codeword.

Figure 8:
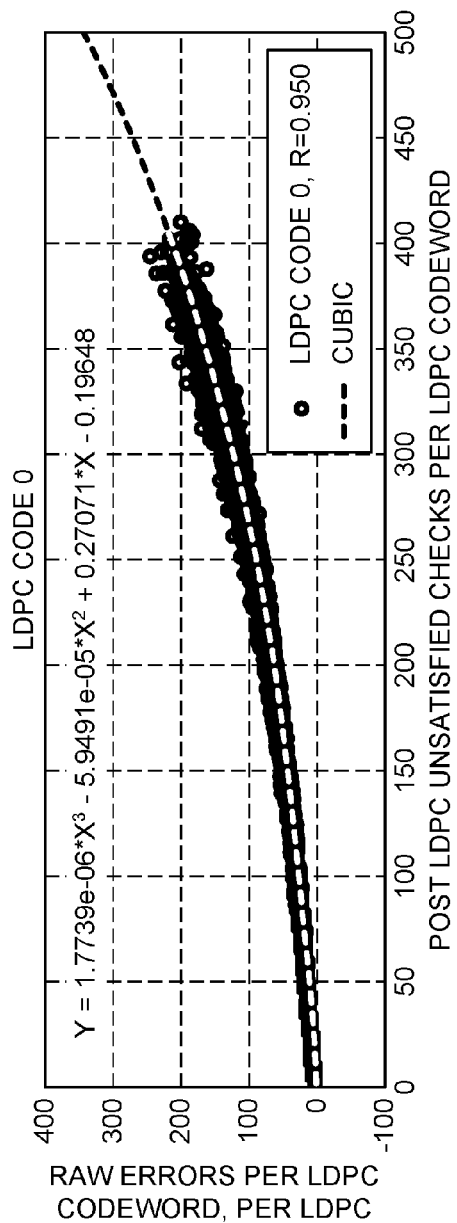
FIG. 8 is a graph of unsatisfied checks per low density parity check codeword for the code rate 0 versus raw bit error rate.

Referring to FIG. 8, a graph of unsatisfied checks per low density parity check codeword for the code rate 0 versus raw bit error rate is shown. The graph shows a generally linear curve. A more accurate representation of the scatter plot curve may be achieved by applying a curve fitting routine to the data. For example for the code rate 0, a cubic curve fitting models the curve by equation 1 as follows:

$$Y=1.774\times10^{-6}X^3-5.95\times10^{-5}X^2+0.271X-0.197 \quad (1)$$

The variable Y is the number of errors per codewords and the variable X is the number of unsatisfied checks per codeword. The higher ordered terms of the variable X may be dominated by the first order term. As such, equation 1 can be reduced to equation 2 as follows:

$$Y=0.271X-0.197 \quad (2)$$

Equation 2 shows the general linear relationship.

Figure 9:
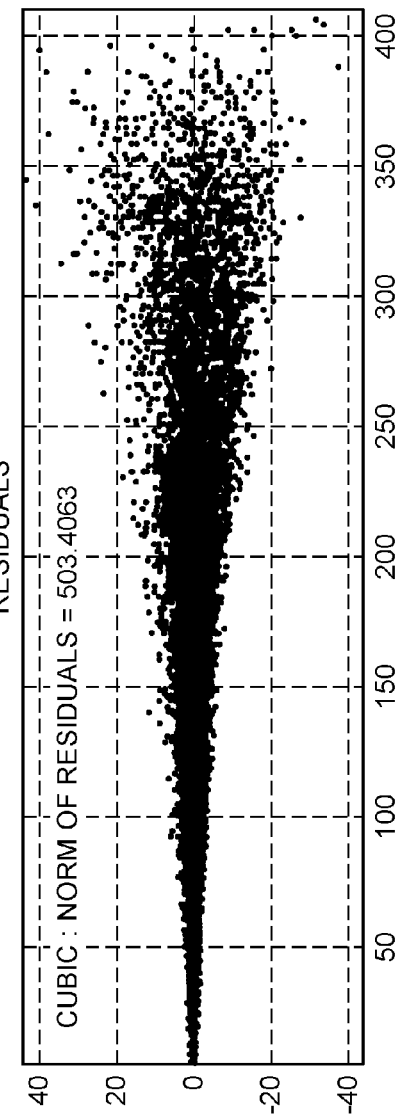
FIG. 9 is a graph of a norm of residuals for a cubic curve fit for FIG. 8.

Referring to FIG. 9, a graph of a norm of residuals for the cubic curve fit for FIG. 8 is shown. For the code rate 0, the norm of residuals is approximately 503. Residuals below approximately 150 on the X-axis are correctable and have a bit error rate that varies by approximately ±3 percent. High bit error rates (e.g., above approximately 250) are uncorrectable and yield a larger spread of residuals (e.g., ±20 percent).

In a similar fashion to deriving equations for the raw bit error from the number of unsatisfied checks, equations may be derived, such as by curve fitting, for the error bounds defined by the residuals as illustrated in FIG. 9. For example, with low numbers of unsatisfied checks, more certainty exists in the estimate of the raw bit error rate than with higher numbers of unsatisfied checks, and equations may be derived to specify the degree of uncertainty, such as by confidence intervals.

Figure 10:
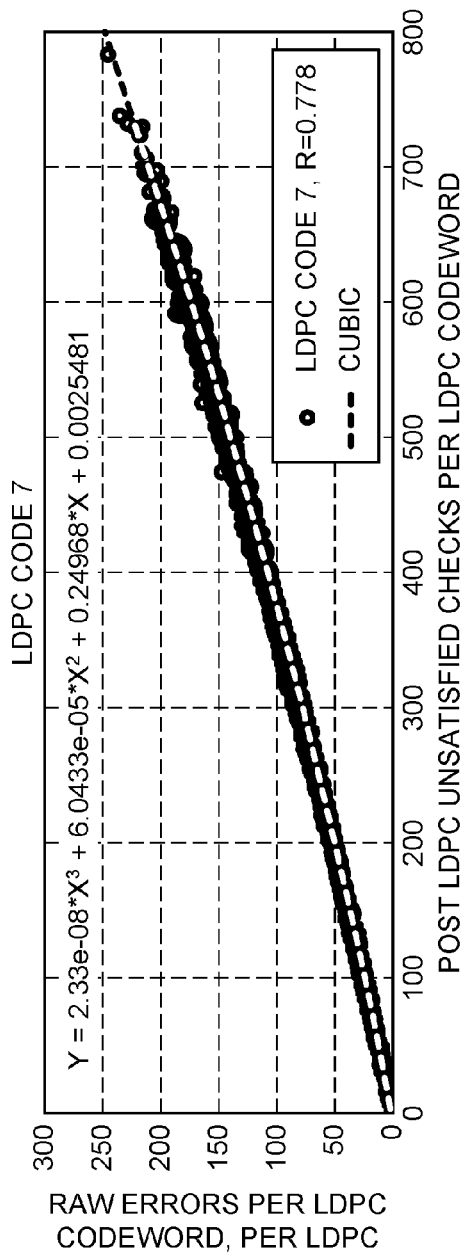
FIG. 10 is a graph of unsatisfied checks per low density parity check codeword for the code rate 7 versus raw bit error rate.

Referring to FIG. 10, a graph of unsatisfied checks per low density parity check codeword for the code rate 7 versus raw bit error rate is shown. The graph shows a generally linear curve. By applying the cubic curve fitting for the code rate 7, the curve is modeled by equation 3 as follows:

$$Y=2.33\times10^{-8}X^3+6.04\times10^{-5}X^2+0.24971X+0.00255 \quad (3)$$

Figure 11:
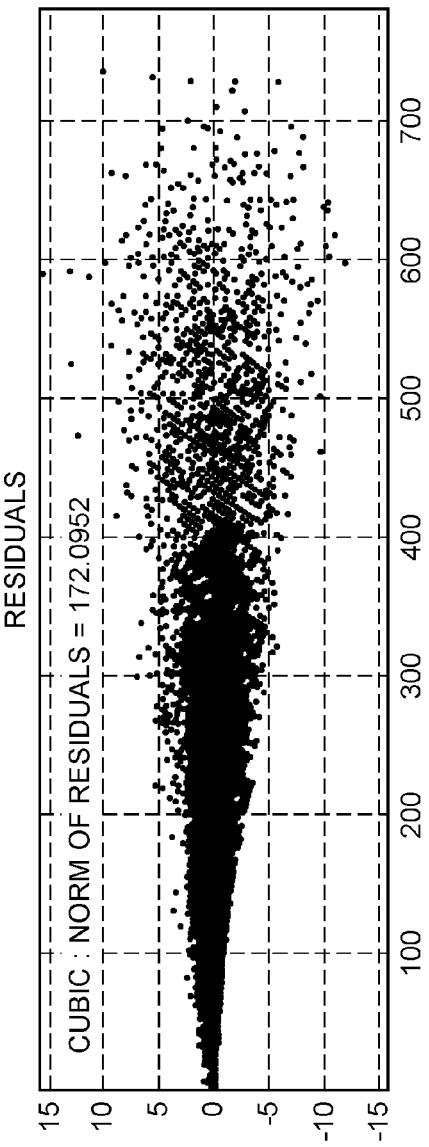
FIG. 11 is a graph of a norm of residuals for the cubic curve fit for FIG. 10.

Referring to FIG. 11, a graph of a norm of residuals for the cubic curve fit for FIG. 10 is shown. For the code rate 7, the norm of residuals is approximately 172. Hence, the code rate 7 covers a wider range of linearity and may be fitted to a cubic equation much more accurately than the code rate 0. Generally, a lower code rate furnishes a wider range of linearity.

Figure 12:
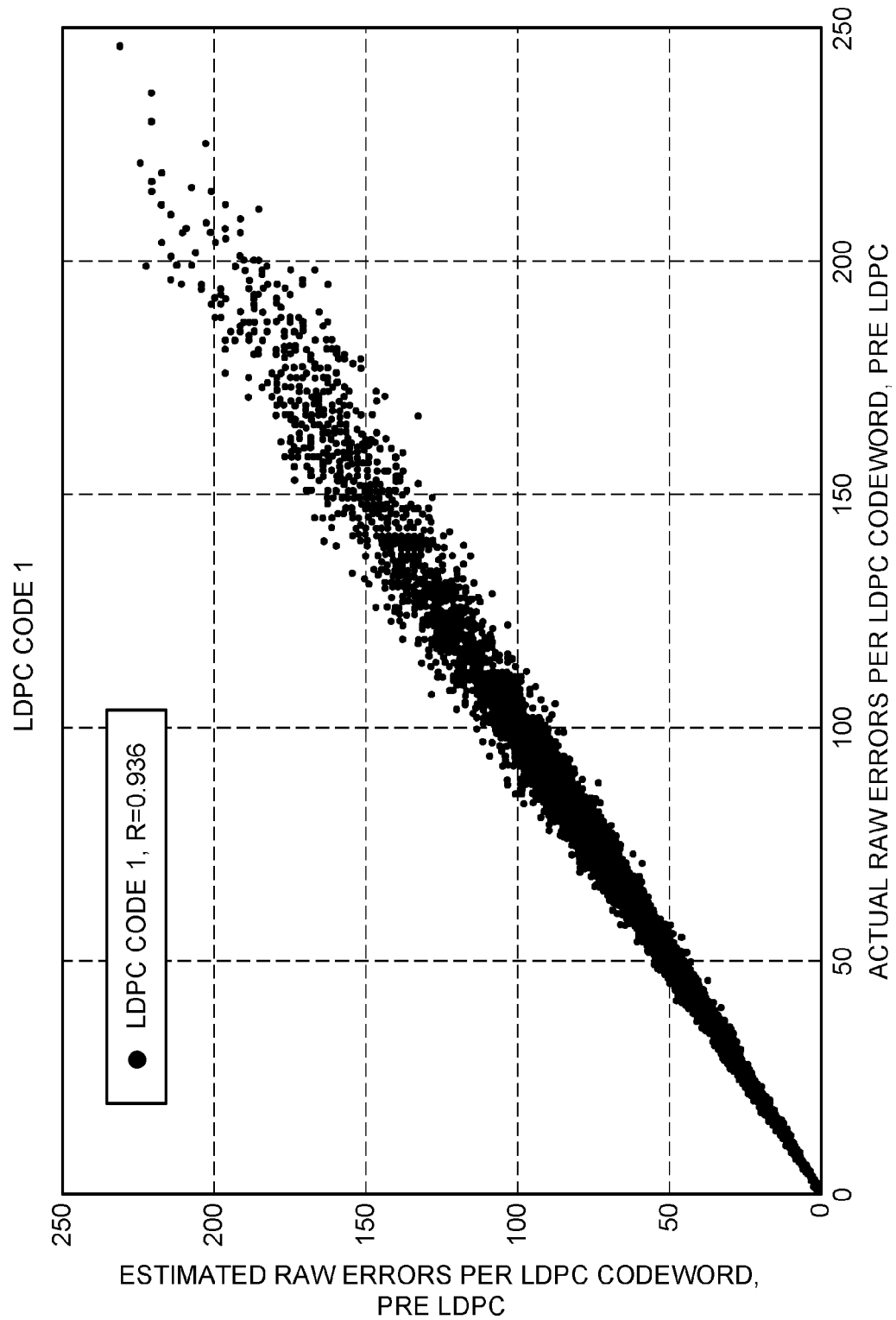
FIG. 12 is a graph of actual raw bit errors per low density parity check codeword for the code rate 1 versus estimated raw bit errors.

Referring to FIG. 12, a graph of actual raw bit errors per low density parity check codeword for the code rate 1 versus estimated raw bit errors is shown. By applying the cubic curve fitting for the code rate 1 (e.g., rate=0.936), the curve is modeled by equation 4 as follows:

$$Y=7.84\times10^{-7}X^3+7.51\times10^{-5}X^2+0.26X+0.084 \quad (4)$$

The graph and equation 4 show a generally linear relationship.

Figure 13:
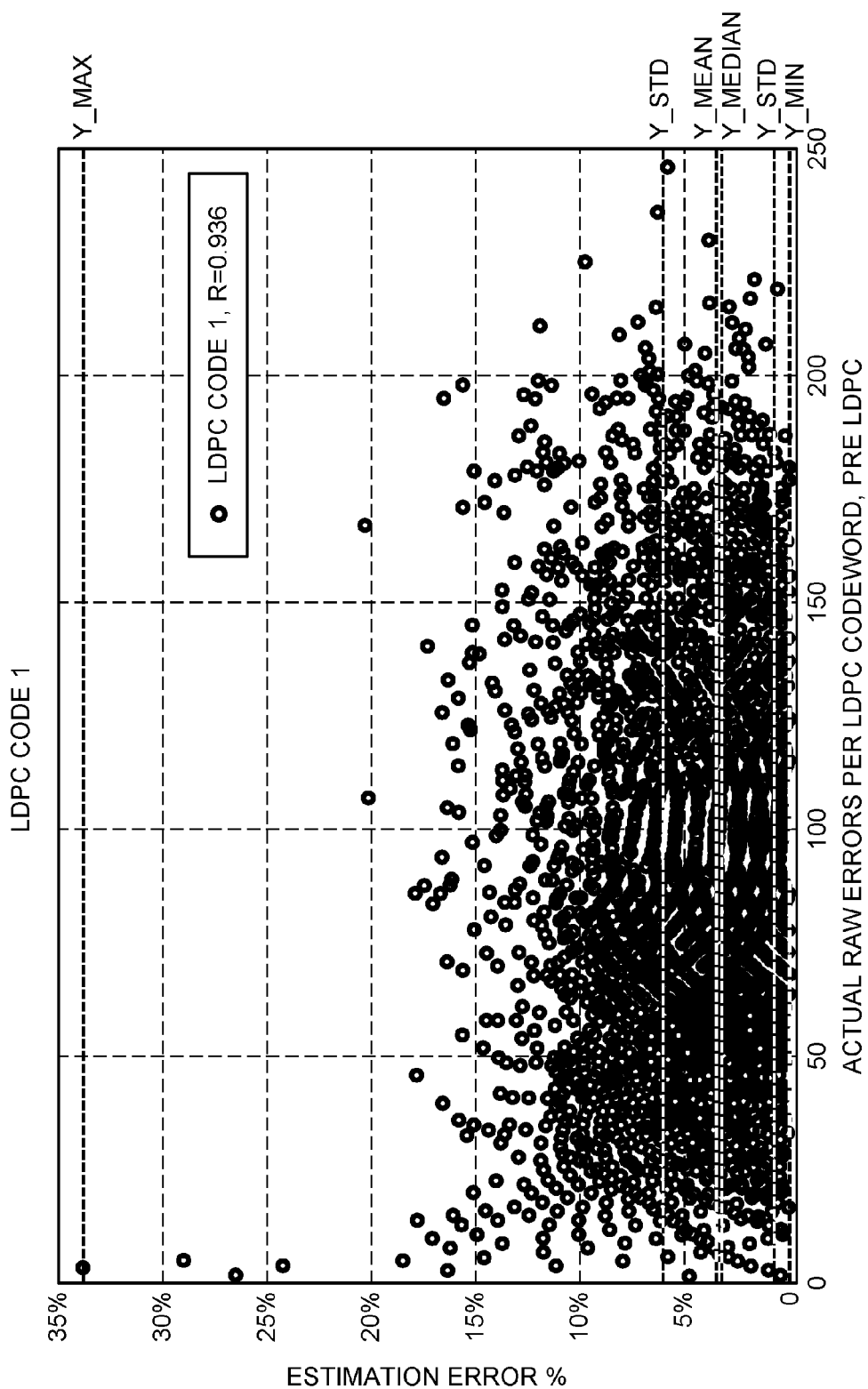
FIG. 13 is a graph of actual raw bit errors per low density parity check codeword for the code rate 1 versus estimated error percentage.

Referring to FIG. 13, a graph of actual raw bit errors per low density parity check codeword for the code rate 1 versus estimated error percentage is shown. A mean value and a median value of the estimation errors are approximately the same and generally range between 3 percent to 4 percent of the number of errors per low density parity check codeword. A one standard deviation range around the mean value, which bounds 68.2 percent of all codewords, is between zero percent and 6 percent. Therefore, approximately 68 percent of all codewords have estimation errors of less than 6 percent of the actual number of errors. A two standard deviations range, hence at 9 percent, indicates that 95.4 percent of all codewords have estimation errors of less than 10 percent of the actual number of errors.

Figure 14:
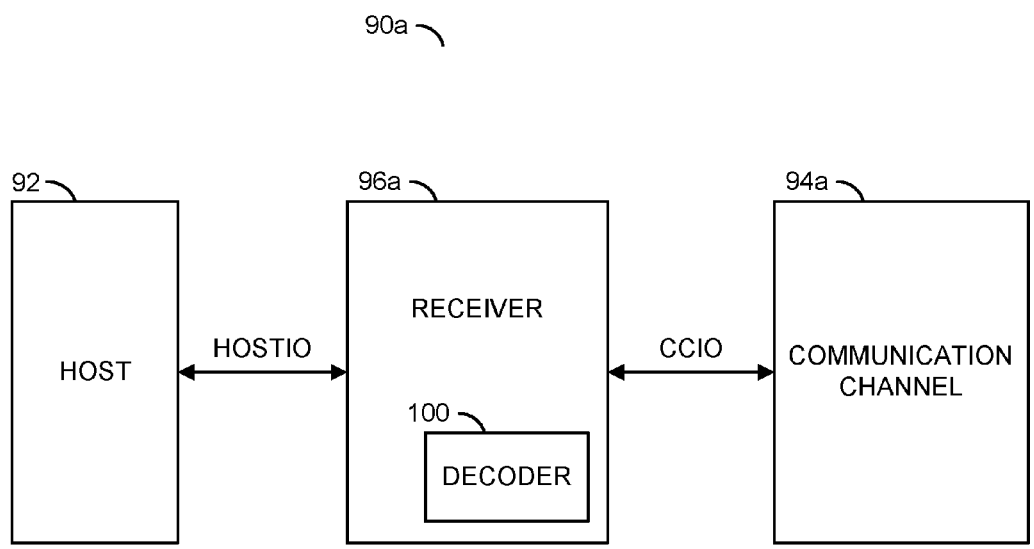
FIG. 14 is a block diagram of an example implementation of another apparatus.

Referring to FIG. 14, a block diagram of an example implementation of an apparatus 90a is shown. The apparatus (or circuit or device or integrated circuit) 90a implements a computer connected to a communication system. The apparatus 90a generally comprises the block 92, a block (or circuit) 94a and a block (or circuit) 96a. The circuit 96a generally comprises the block 100. The circuits 92a and 96a may represent modules and/or blocks that may be implemented as hardware, software, a combination of hardware and software, or other implementations.

The circuit 94a is shown implementing a communication device. The circuit 94a is operational to transfer codewords to the circuit 96a via a signal (e.g., CCIO). The codewords are error correction coded when received by the circuit 96a. In some embodiments, the signal CCIO conveys the receive codewords from the circuit 94a to the circuit 96a. In other embodiments, the signal CCIO conveys transmit codewords from the circuit 96a to the circuit 94a. According to various embodiments, the signal CCIO is bidirectional carrying codewords in both directions.

The circuit 96a is shown implementing a receiver circuit. The circuit 96a is operational to receive error correction coded data from the circuit 94a via a signal (e.g., CCIO). The circuit 96a (through the circuit 100) corrects any errors in the received codewords and passes the corrected data to the circuit 92 in the signal HOSTIO.

While the circuit 100 is shown as part of the circuits 96 and 96a, the circuit 100 may be located differently in other embodiments. For example, the circuit 100 may be located in the circuit 92, a disk drive, at a point in a network (e.g., within the communication channel 94a), or other similar locations.

The bit error rate estimation can also be used with other encoding schemes, in addition to the low density parity check code. Generally, the bit error rate estimation is suitable for any decode process that generates syndrome information. The decode processes include, but are not limited to polar codes and Bose Chaudhuri Hocquenghem (e.g., BCH) codes.

Implementing decode processes that have a sparse H matrix provide an approximately linear relationship between the number of unsatisfied parity checks and the raw bit error rate. Using the syndrome information from a single or a few runs of an iterative decoding process also helps maintain the linear relationship between the raw bit error rate and the unsatisfied parity checks. In some embodiments, multiple runs of the iterative decoding process are performed and a curve fit transformation (or mapping) is applied to the number of unsatisfied parity checks to calculate the raw bit error rate. The transformations between the number of unsatisfied parity checks and the raw bit error rate is typically determined off-line using random data with random errors.

Numerical studies have shown a strong linear relationship between raw bit errors in the codewords and the number of unsatisfied checks at an initial low density parity check decoder iteration. The decoder may provide the quality metric and/or the code rate used to write the data even if the decoding process does not converge, so the scheme works for scenarios in which the data is highly corrupted. An almost linear relationship exists below a bit error rate of approximately $10^{-2}$ or up to the (number of parity bits)/(codeword length). Furthermore, the quality metric scheme operates independently of which code rate was used to store the data in multi-coded system, as the linear time approach of the scheme blindly finds which code was used to encode the written data.

The functions performed by the diagrams of FIGS. 1-3 and 14 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMs (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is (are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus, implemented in hardware, comprising:
a memory configured to store data; and
a controller configured to
  process a plurality of read/write operations to/from the memory,
  receive a codeword from the memory,
  generate a plurality of syndromes of the codeword at a plurality of possible code rates,
  generate a plurality of count values by counting a number of unsatisfied parity checks in each of the plurality of syndromes,
  generate a plurality of normalized values by dividing the plurality of count values by a plurality of lengths of the plurality of possible code rates respectively, and
  determine a bit error rate value of the memory based on a lowest value among the plurality of normalized values.

2. The apparatus according to claim 1, wherein the bit error rate value is an estimate of a raw bit error rate of the memory.

3. The apparatus according to claim 1, wherein the plurality of normalized values are generated in response to a failure of a decode of the codeword to converge.

4. The apparatus according to claim 1, wherein the controller is further configured to generate a signal conveying one of the plurality of possible code rates corresponding to the lowest value as an estimated code rate used to create the codeword in the memory.

5. The apparatus according to claim 1, wherein the bit error rate value is further based on a number of decoding iterations completed when the lowest value was counted.

6. The apparatus according to claim 1, wherein the bit error rate value is further based on a relationship between a plurality of possible bit error rate values and a plurality of possible count values.

7. The apparatus according to claim 1, wherein the syndromes are generated using a low density parity check decoding procedure.

8. The apparatus according to claim 1, further comprising:
a communication channel configured to transfer the codeword from the memory to the controller.

9. The apparatus according to claim 1, wherein the memory and the controller are part of a solid-state drive.

10. A method, implemented in hardware, for determining a quality metric using unsatisfied parity checks, comprising the steps of:
receiving a codeword from a memory at a controller;
generating a plurality of syndromes of the codeword at a plurality of possible code rates;
generating a plurality of count values by counting a number of the unsatisfied parity checks in each of the plurality of syndromes;
generating a plurality of normalized values by dividing the plurality of count values by a plurality of lengths of the plurality of possible code rates respectively; and
determining a bit error rate value of the memory based on a lowest value among the plurality of normalized values.

11. The method according to claim 10, wherein the bit error rate value is an estimate of a raw bit error rate of the memory.

12. The method according to claim 10, wherein the plurality of normalized values are generated in response to a failure of a decode of the codeword to converge.

13. The method according to claim 10, further comprising the step of:
generating a signal conveying one of the plurality of possible code rates corresponding to the lowest value as an estimated code rate used to create the codeword in the memory.

14. The method according to claim 10, wherein the bit error rate value is further based on a number of decoding iterations completed when the lowest value was counted.

15. The method according to claim 10, wherein the bit error rate value is further based on a relationship between a plurality of possible bit error rate values and a plurality of possible count values.

16. The method according to claim 10, wherein the syndromes are generated using a low density parity check decoding procedure.

17. The method according to claim 10, further comprising the step of:
transferring the codeword in a communication channel from the memory to the controller.

18. The method according to claim 10, wherein the steps are performed in a solid-state drive.

19. An apparatus, implemented in hardware, comprising:
an interface configured to process a plurality of read/write operations to/from a memory; and
a control circuit configured to
receive a codeword from the memory via the interface,
generate a plurality of syndromes of the codeword at a plurality of possible code rates,
generate a plurality of count values by counting a number of unsatisfied parity checks in each of the plurality of syndromes,
generate a plurality of normalized values by dividing the plurality of count values by a plurality of lengths of the plurality of possible code rates respectively, and
determine a bit error rate value of the memory based on a lowest value among the plurality of normalized values.

20. The apparatus according to claim 19, wherein the interface and the control circuit are part of a solid-state drive.

* * * * *